(12) United States Patent
Muller et al.

(10) Patent No.: US 8,929,069 B2
(45) Date of Patent: Jan. 6, 2015

(54) ELECTRIC VEHICLE CHARGING SYSTEM WITH ROBUSTNESS FEATURES AND UNIVERSAL PORT

(75) Inventors: Michael Muller, Harper Woods, MI (US); Charles K. Yankitis, New Baltimore, MI (US); David P. Futkos, Willoughby, OH (US); Charles E. Phillips, III, Madison, OH (US); Matthew C. Schuping, Concord Township, OH (US); Jeff Hudnut, Berkley, MI (US)

(73) Assignee: Bosch Automotive Service Solutions LLC, Warren, MI (US)

( * ) Notice: Subject to any disclaimer, the term of this patent is extended or adjusted under 35 U.S.C. 154(b) by 188 days.

(21) Appl. No.: 13/485,179

(22) Filed: May 31, 2012
(Under 37 CFR 1.47)

(65) Prior Publication Data
US 2013/0322017 A1  Dec. 5, 2013

(51) Int. Cl.
*H05K 7/20* (2006.01)
*H05K 5/02* (2006.01)
*B60L 3/00* (2006.01)
*B60L 3/04* (2006.01)
*B60L 11/18* (2006.01)

(52) U.S. Cl.
CPC .............. *H05K 5/0213* (2013.01); *Y02T 90/128* (2013.01); *Y02T 10/7005* (2013.01); *B60L 2230/16* (2013.01); *B60L 3/0069* (2013.01); *Y02T 90/163* (2013.01); *Y02T 90/121* (2013.01); *Y02T 90/14* (2013.01); *B60L 2230/12* (2013.01); *B60L 3/04* (2013.01); *Y02T 10/7088* (2013.01); *B60L 2240/547* (2013.01); *B60L 11/1818* (2013.01)

USPC ........... 361/690; 361/700; 361/704; 361/714; 320/108; 320/109; 307/102

(58) Field of Classification Search
USPC ................ 320/108–109; 307/9–10, 102–104; 361/700–704, 690
See application file for complete search history.

(56) References Cited

U.S. PATENT DOCUMENTS

| 4,820,187 A | 4/1989 | May |
| 5,462,439 A | 10/1995 | Keith |

(Continued)

FOREIGN PATENT DOCUMENTS

WO  2010055411 A1  5/2010

OTHER PUBLICATIONS

Written Opinion and International Search Report for PCT/US2013/043505; dated Oct. 1, 2013.

(Continued)

*Primary Examiner* — Tuan T Dinh
(74) *Attorney, Agent, or Firm* — Baker & Hostetler LLP

(57) ABSTRACT

An electric vehicle supply equipment may include a first cover element including a well portion to accommodate a first circuitry, wherein the first circuitry includes a chimney stack that couples to a venting hole. Also, the electric vehicle supply equipment may include a second cover element including a recess portion to accommodate a second circuitry, wherein the second circuitry includes a charcoal filter that couples to the chimney stack to absorb impurities generated by the first circuitry and the second circuitry. Further, the electric vehicle supply equipment includes a universal/serial connection port configured to couple to peripheral devices, wherein the universal/serial connection port is an optical coupled connection.

12 Claims, 5 Drawing Sheets

(56) References Cited

U.S. PATENT DOCUMENTS

| | | | |
|---|---|---|---|
| 5,548,200 A | 8/1996 | Nor et al. | |
| 5,563,491 A | 10/1996 | Tseng | |
| 5,721,481 A | 2/1998 | Narita et al. | |
| 5,803,215 A | 9/1998 | Henze et al. | |
| 6,198,251 B1 | 3/2001 | Landon | |
| 6,316,908 B2 | 11/2001 | Kajiura | |
| 6,483,272 B1 | 11/2002 | Terada et al. | |
| 6,833,683 B2 | 12/2004 | Winkler | |
| 6,905,362 B2 | 6/2005 | Williams | |
| 6,951,206 B2 | 10/2005 | Kishimoto | |
| 7,253,584 B2 | 8/2007 | Souther et al. | |
| 7,254,468 B2 | 8/2007 | Pillar et al. | |
| 7,278,878 B2 | 10/2007 | Draggie et al. | |
| 7,420,125 B2 * | 9/2008 | Tsukamoto et al. | 174/153 G |
| 7,579,807 B2 | 8/2009 | Funabashi et al. | |
| 7,690,453 B2 | 4/2010 | Kinoshita et al. | |
| 8,085,034 B2 | 12/2011 | Sirton | |
| 8,111,043 B2 | 2/2012 | Redmann | |
| 8,143,842 B2 | 3/2012 | Tyler et al. | |
| 8,151,916 B2 | 4/2012 | Gearhart | |
| 2008/0053716 A1 * | 3/2008 | Scheucher | 180/2.1 |
| 2009/0313098 A1 | 12/2009 | Hafner et al. | |
| 2010/0017249 A1 | 1/2010 | Fincham et al. | |
| 2010/0154437 A1 | 6/2010 | Nepsha et al. | |
| 2010/0174667 A1 | 7/2010 | Vitale et al. | |
| 2010/0241560 A1 | 9/2010 | Landau-Holdsworth et al. | |
| 2010/0268406 A1 | 10/2010 | Ito et al. | |
| 2011/0011710 A1 | 1/2011 | Dodal et al. | |
| 2011/0029146 A1 * | 2/2011 | Muller et al. | 700/293 |
| 2011/0037429 A1 * | 2/2011 | DeBoer et al. | 320/109 |
| 2011/0074351 A1 | 3/2011 | Bianco et al. | |
| 2011/0169447 A1 | 7/2011 | Brown et al. | |
| 2011/0202418 A1 * | 8/2011 | Kempton et al. | 705/26.1 |
| 2011/0269332 A1 * | 11/2011 | Kim et al. | 439/470 |
| 2011/0320056 A1 * | 12/2011 | Brown et al. | 700/295 |
| 2012/0091824 A1 * | 4/2012 | Campolo et al. | 307/135 |
| 2013/0021162 A1 * | 1/2013 | DeBoer et al. | 340/635 |
| 2013/0201641 A1 * | 8/2013 | Soden et al. | 361/752 |

OTHER PUBLICATIONS

International Search Report & Written Opinion for PCT/US2011/066380, prepared Jun. 13, 2012.

Robert Krause, et al., "Solid-State Relays Simplify Monitoring Electric-Car Battery Voltage," EDN, Feb. 19, 2004, 83-84.

International Search Report issued in PCT/US2013/043503 dated Dec. 23, 2013.

International Search Report & Written Opinion for PCT/US2012/040462, mailed Aug. 27, 2012.

* cited by examiner

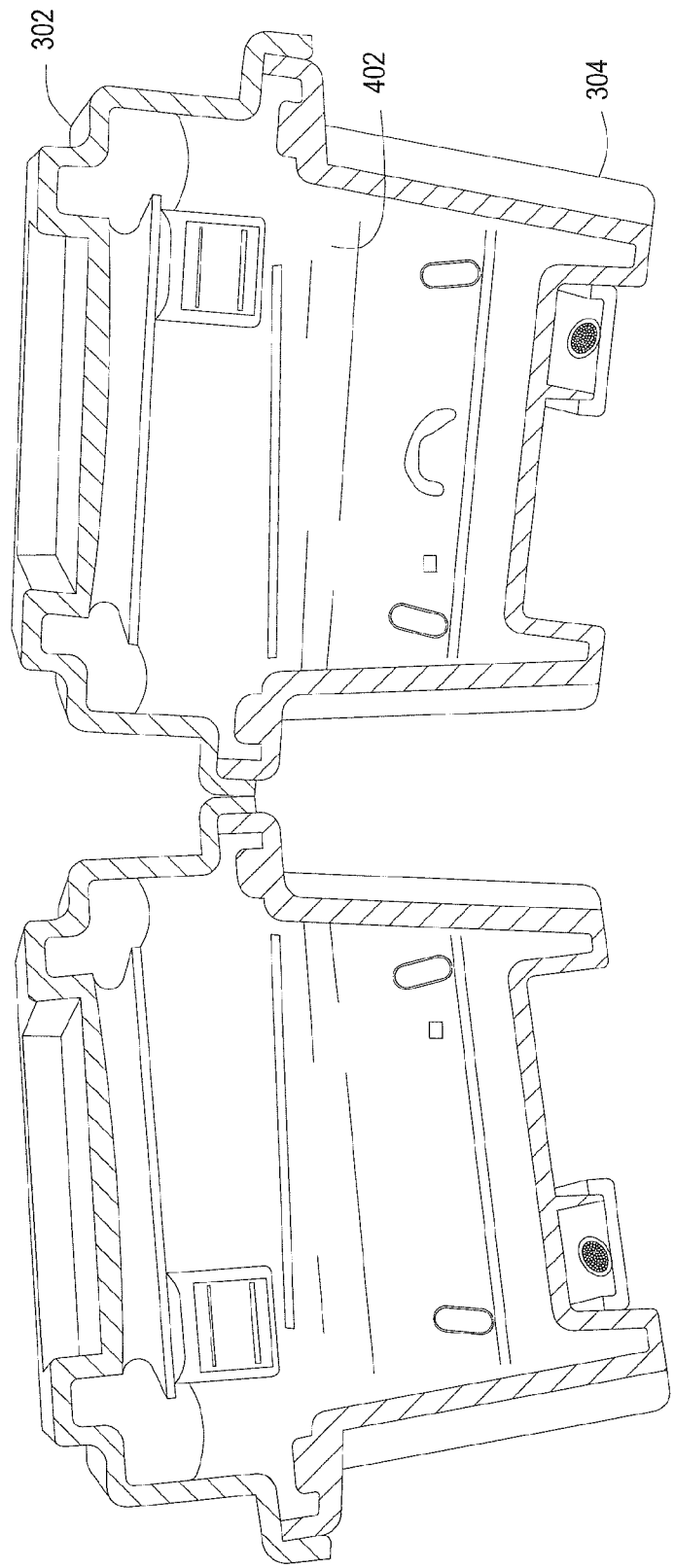

ELECTRIC VEHICLE CHARGING SYSTEM WITH ROBUSTNESS FEATURES AND UNIVERSAL PORT

FIELD OF THE INVENTION

The invention relates generally to an electric vehicle charging system. More particularly, the invention relates to an electric vehicle charging system that has robustness features to prolong the life of the system and a universal port to access and program the electric vehicle charging system.

BACKGROUND OF THE INVENTION

Vehicle batteries often need to be charged as the stored power from time to time may become depleted. This is particularly true with battery-powered vehicles, such as electric vehicles, that have no other means to easily self-charge. However, other types of vehicles that do typically have a self-charging capability, such as hybrid cars, can also benefit from being charged from time to time. Battery chargers for vehicles are typically installed outdoors so that the electric vehicle can drive up to it and charge while the owner is shopping or at work.

The charger is typically exposed to the environment, which may cause some level of damage to the charger such as corrosion, water exposure that may short circuit or otherwise damage the internal electrical parts or the like. The charger can also experience wear and tear during normal operations. For example, the charger may operate at a high voltage potential in order to charge the vehicle in a short period of time and thus may generate a high temperature during the charging operation. Also, due to limited space available in the charger, various components of the charger are located in close proximity to each other and thus, may lead to short circuiting of the components. Further, impurities and smoke may be generated during the operation of the charger that may lead to malfunction of the charger. Additionally, as updates and use may change over time, the charger needs to be easily accessed and programmed by the user or a technician.

Accordingly, there is a need for a battery charger that is easy to use and access for updates or programming, and that is resistant to environmental or operational damage.

SUMMARY OF THE INVENTION

The foregoing needs are met, to a great extent, by the invention, wherein in some embodiments provide more robust features to protect the charger and a universal connection to access and program the charger as needed.

In accordance with an embodiment of the invention, an electric vehicle supply equipment is provided. The electric vehicle supply equipment may include a first cover element comprising a well portion to accommodate first circuitry, wherein the first circuitry includes a chimney stack that couples to a venting hole. Also, the electric vehicle supply equipment may include a second cover element including a recess portion to accommodate a second circuitry, wherein the second circuitry includes a charcoal filter that couples to the chimney stack to absorb impurities generated by the first circuitry and the second circuitry. Further, the electric vehicle supply equipment may include a universal/serial connection port to couple peripheral devices, wherein the universal/serial connection port is an optical coupled connection.

There has thus been outlined, rather broadly, certain embodiments of the invention in order that the detailed description thereof herein may be better understood, and in order that the contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. In addition, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the invention. It is important, therefore, that the claims be regarded as including such equivalent constructions insofar as they do not depart from the spirit and scope of the invention.

BRIEF DESCRIPTION OF THE DRAWINGS

FIG. 4A and FIG. 4B show a sectional views taken alone line IVA-IVA and IVB-IVB of the housing of the EVSE shown in FIG. 1 according to an embodiment of the invention.

DETAILED DESCRIPTION

Figure 1:
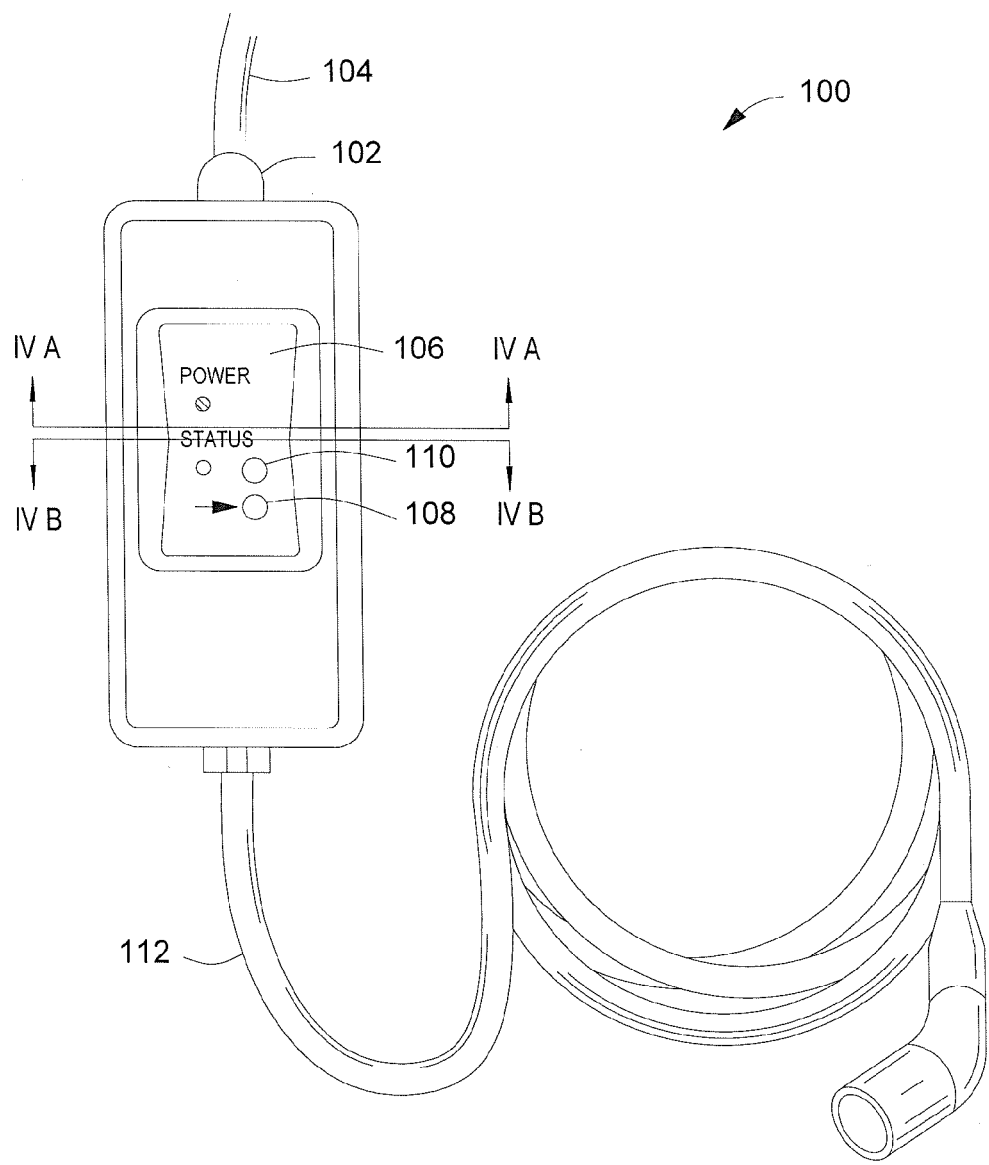
FIG. 1 shows an electric vehicle supply vehicle (EVSE) in accordance with one embodiment of the invention.

FIG. 1 shows an electric vehicle supply equipment (EVSE) 100 in accordance with one aspect of the invention. The EVSE 100 is for connecting an electric vehicle, such as a battery electric vehicle (BEV) or a plug-in hybrid electric vehicle (PHEV), to a high voltage electricity source. For example, the EVSE 100 may include an apparatus for connecting the electric vehicle to a power source. The EVSE 100 may be employed to make a circuit connection to allow power from an electrical socket, like a wall socket, to flow to a charging circuit within the electric vehicle. The wall socket may be in a house, at a powering station outside the house, or the like. The power station may be positioned, for example, at a parking garage, at a public parking space, at a rest stop, a conventional gas station, or a power station. Further, the EVSE 100 may be constructed to at least meet industry standards, such as SAE J1772, UL 2594, and NEC Article 625. The SAE J2836 vehicle communication standard may also be considered in constructing the EVSE 100.

The EVSE 100 may include waterproof connector 102 and power wires 104. The waterproof connector 102 may include a construction that keeps water from being able to seep into the internal structure of the EVSE 100. The power wires 104 may extend from the top of the EVSE 100 to couple to an electrical socket, such as a wall socket. The power wires 104 may extend to the power source (not shown). Also, the EVSE 100 may have a socket connector 112 to couple the EVSE 100 to the vehicle. Once coupled, to both the wall socket and the vehicle, the EVSE 100 may allow passage of electrical current from the wall socket to the electric vehicle, thus recharging the vehicles' batteries. The EVSE 100 may also be configured for various input voltages and currents. The EVSE 100 may be configured to operate based on one, two, or three phase circuits. Additionally, the EVSE 100 may be configured to operate on different current circuits. More specifically, the circuit of the EVSE 100 may include the ability to be adjusted to operate with different current sources as desired by the user. In particular, the EVSE 100 may include a circuit to provide a digital input to the EVSE 100. The digital input indicating an operating current for the EVSE 100. In one particular aspect, the digital input may be a binary coded decimal. The binary coded decimal may be generated by a dial based input component. Other configurations to indicate to the EVSE 100 that a different operating current is desired by the user are also contemplated by the invention herein. The EVSE 100 may be a modified SPX™ Power Xpress EVSE, model no. EL-50600 available from SPX, Warren, Mich., USA. However, it is contemplated that other types of battery charges may be used.

The EVSE 100 may include a display screen 106, an input device 108, and a venting hole 110. The display screen 106 may permit a user to see various conditions of the battery as detected by the EVSE 100. In addition, the display screen 106 may also display questions to which the user may input a response via the input device 108. In some embodiments of the invention, the input device 108 may be a keyboard, a button, or a switch. In other embodiments of the invention, the input device 108 can include any device that can input data into the EVSE 100. The input device 108 may also not be a separate feature from the display screen 106 but may be part of the display screen 106 such as a touch screen. The input device 108 may not be a standard keyboard but may be merely various keys having functions when pressed. Any other suitable means for inputting data may be incorporated as part of the input device 108. The venting hole 110 may allow air to enter and exit from the housing of the EVSE 100. Moreover the venting hole 110 may include hydrophobic properties in order to prevent water from entering the housing of the EVSE 100.

Figure 2A:
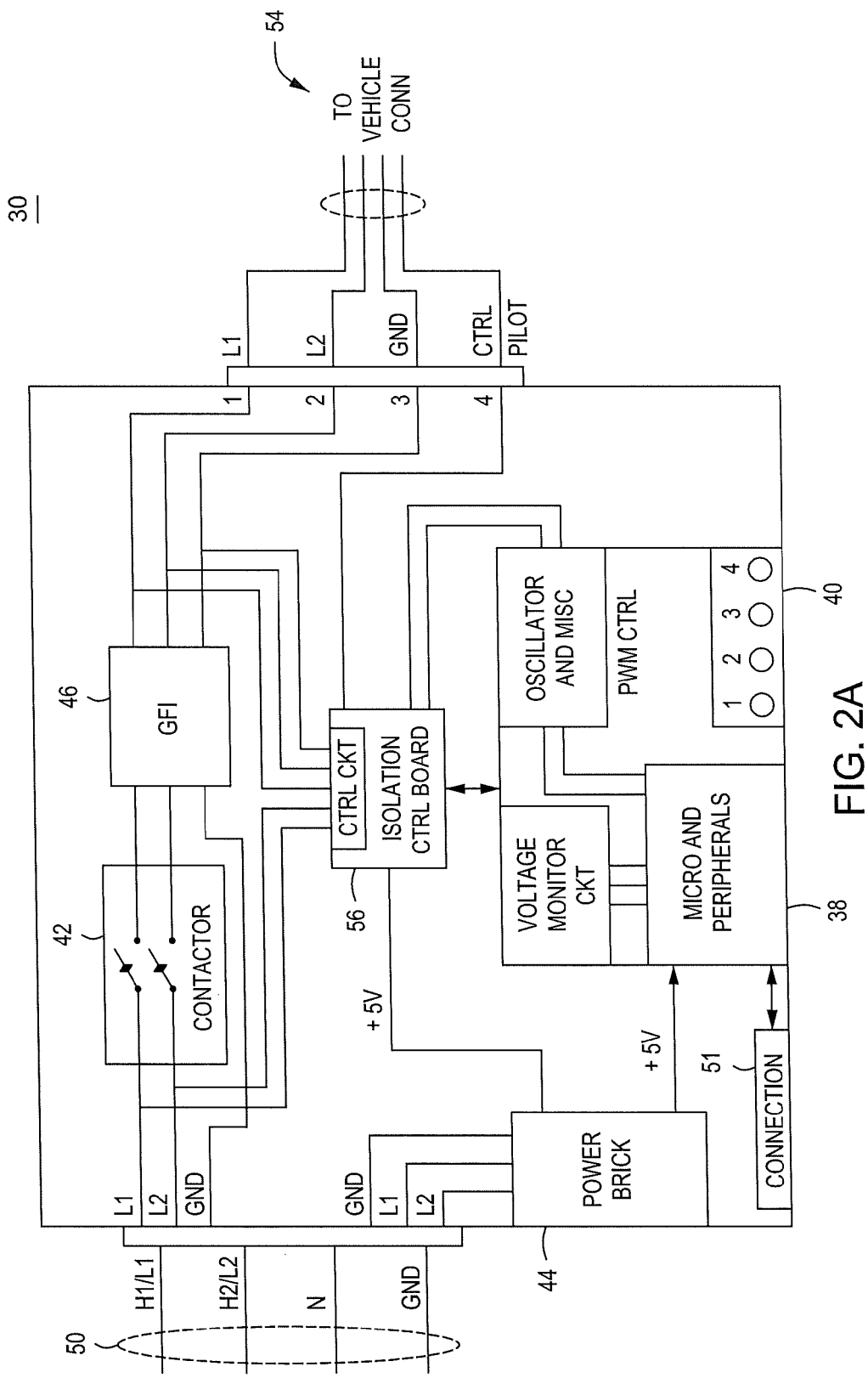
FIG. 2A is a schematic view of an apparatus for connecting an electric vehicle to a high voltage power source according to one embodiment of the invention.
Figure 2B:
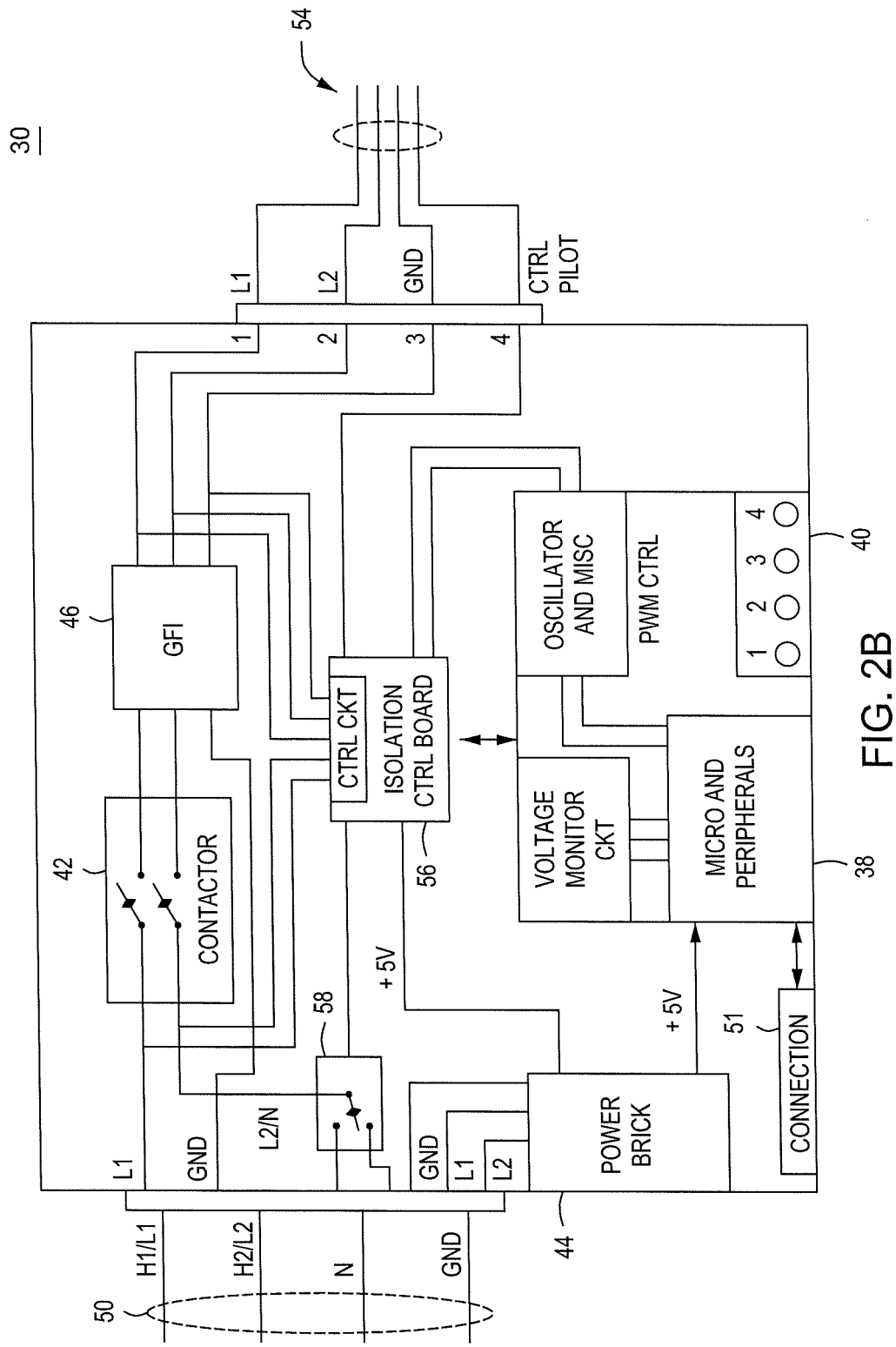
FIG. 2B is a schematic view of an apparatus for connecting an electric vehicle to a Level I or Level II power source according to another embodiment of the invention.

FIG. 2A is a schematic view of an apparatus for connecting an electric vehicle to a high voltage power source according to another embodiment of the invention. FIG. 2B is a schematic view of an apparatus for connecting an electric vehicle to a Level I or Level II power source according to still another embodiment of the invention. The EVSE 100 may further include a relay 42 (referred to in FIGS. 2A and B as a contactor), a voltage regulating device 44 (referred to in FIGS. 2A and B as a power brick), a breaking device 46 (referred to in FIGS. 2A and B as a GFI), and a switch 58 (not shown in FIG. 2A), some or all of which may be connected by an electric conduit 50. A control circuit 56 may act as a buffer between different parts of the EVSE 100. At one end of the EVSE 100 is a socket connector associated with conduit 50 and at the other end is a vehicle connector 54 (also shown in FIG. 3 and explained herein).

The voltage regulating device 44 may be needed to power the electronic components of the EVSE 100. Since the EVSE 100 may draw its power from the same electrical socket it uses to charge the batteries of the electric vehicle, the EVSE 100 will be receiving high voltage electricity. The electrical socket may supply, for example 120 volts, 220 volts, 240 volts, or the like. The high voltage of the power drawn from the electrical socket could damage some of the electronic components of the EVSE 100. Thus, the voltage regulator device 44, such as a transformer or a voltage regulator, may be employed between to the electrical socket and the electrical components of the EVSE 100. The voltage may then be lowered to a level that is manageable to the electrical components, such as, for example, 5 volts or 12 volts. In other embodiments, the voltage regulator device 44 can increase the voltage as needed by the EVSE 100.

In a particular aspect, the voltage regulator device 44 can provide additional voltage levels for operating the relay 42. For example, the voltage regulator device 44 can provide a first low voltage for maintaining the relay in a first position and generate a second higher voltage for moving the relay 42 to a second position. These two different voltages provided to the relay 42 allow the relay 42 to release faster, saves energy consumption, and allows the relay to operate cooler.

While the voltage regulating device 44 may regulate the voltage to parts of the EVSE 100, there are parts where electricity may flow unaltered from the electrical socket to the electric vehicle. An electric conduit 50 may run the length of the EVSE 100.

In one embodiment of the invention, the electric conduit 50 may be of the type having a gauge and/or rating such that it may appropriately handle the range of supplied current from the electrical socket. That being, the electric conduit 50 should be able to handle at least the highest supplied current, and in turn it will also be able to handle lower levels of current. The electric conduit 50 may be one appropriate for handling Level I and Level II charging or any level of charging. The electric conduit 50 suited for Level II charging may include a combination of conduits including, for example, two conduits for power supply (L1 and L2), one conduit as a neutral, and one conduit as a ground. The supplied current may be split over L1 and L2, thus aiding in supplying the proper current for Level I and Level II charging.

In connecting the electric conduit to the internal components of the EVSE 100, it may be convenient to connect some or all of the combination of conduits that make up the electric conduit 50 to the different internal components. For example, the voltage regulating device 44, as discussed herein, receives power from the supplied power from the electrical socket the EVSE 100 connects. To receive this power, the voltage regulating device 44 may be connected to, at least, L1 and/or L2.

In one embodiment, the electric conduit 50 includes a relay 42 that may be placed to bridge segments of the electric conduit 50, allowing the EVSE 100 to start and stop the flow of current to the electric vehicle. The electric conduit 50 may optionally be connected to a voltage regulator to step up or step down the voltage passed to the electric vehicle. Further, to aid in providing the proper current to charge the electric vehicle, it is contemplated to provide the relay 42 with some or all of the current provided by the electrical socket. Power supply conduits L1 and L2 may both be connected to the relay 42. Alternatively, the relay 42 may be connected to only either conduit L1 or L2.

In an alternative embodiment, it may be that when only connected to conduit L1 or L2, the relay 42 may only enable the EVSE 100 to be able to provide the vehicle with Level I charging capabilities. Thus, to enable the EVSE 100 to provide Level II charging capabilities, as well as Level I charging, it may be a possible to provide a switch 58 that will allow the EVSE 100 to selectively connect the unconnected conduit, either L1 or L2, to the relay 42. In one embodiment, the switch 58 may be connected to, at least, the conduit, either L1 or L2, not already connected to the relay 42. Further, the switch 58 may be connected to the control circuit 56 that controls when the switch allows for the selective connection of the unconnected conduit, either L1 or L2, to the relay 42. The control function will be discussed herein.

Also connected to the electric conduit 50 may be a breaking device 46 (also called a ground device, GFI, or a current monitor). The breaking device 46 is intended to cut power along the electric conduit 50 quickly so as to avoid harming a user with a high voltage electric shock, harming the components of the EVSE 100 or damaging the electric vehicle. Such a breaking device 46 may be a ground fault interrupter. If the breaking device 46 trips and cuts power, EVSE 100 may have an auto-reset function to attempt to restore the power transfer to the electric vehicle. The auto-reset function may attempt to restore the power transfer after a determined time and/or for a determined number of tries. The auto-reset function allows for continuous charging of the vehicle should a power surge occurs while the user is asleep or away from the charging location.

The control circuit 56 may be connected to the electric conduit 50 and to the data link. Acting as a buffer between two portions of the EVSE 100, the control circuit may pass signals from the electric conduit 50 representing the voltage on the electric conduit 50 to the processor 38. From these signals, the processor 38 may react accordingly to control the relay 42 and the breaking device 46. Further, the processor 38, and other components, such as a voltage monitor, an oscillator, and a pulse width modulator may act accordingly to conduct a number of functions of the EVSE 100. The control circuit 56 may also be connected to the voltage control device 44 for power, and a control pilot pin of a vehicle connector to pass on signals from the vehicle to the other components of the EVSE 100. Additionally the control circuit 56 may include isolation capability. In this regard, the control circuit 56 may include components to isolate the higher voltage portion of conduit 50 from the lower voltage components in the EVSE 100. This isolation capability can be provided with optical couplers including optical transmitters and optical receivers. For example the optical connection may be an infrared optical connection. Other types of isolation connections are also contemplated by the invention.

In the switch's 58 initial state, it will be open, thereby causing a disconnect between the unconnected conduit, either L1 or L2, and the relay 42. When the EVSE 100 is connected to a Level I electrical socket, the control circuit 56 would recognize that there exists a 120 volt drop between the powered conduit, either L1 or L2, and the neutral conduit of the electric conduit 50 and leave the circuit between the unconnected conduit, either L1 or L2, and the relay 42 open. Alternatively, when the EVSE 100 is plugged into a Level II electrical socket, then the control circuit 56 would recognize the power on the unconnected conduit and, either via a signal from the processor 38 or via logical circuitry, provide a signal to the switch 58 to close the circuit between the unconnected conduit and the relay 42. With the circuit closed, the relay 42 is connected to both power supply conduits, L1 and L2, of the electric conduit 50, and the EVSE 30 can provide the electric vehicle with Level II charging capabilities.

The EVSE 100 also includes universal/serial peripheral connection 51 that can add additional functionality to it, including USB, Fire-Wire, card reader, vehicle connector interface (for OBD-II, and the like connections), CD, DVD, memory, wireless communication, and additional hardware and software. The EVSE's software can be updated via the universal/serial peripheral connection 51. Additional hardware can be added to include, for example, additional processor, memory, FPGA (field programmable gate array), ASIC, pin connections, multiplexor and the other hardware to expand the functionality of the EVSE 100.

In another example, the universal/serial peripheral connection 51 may be an optical connection. For example, the universal/serial peripheral connection 51 may be an infrared optical connection. The universal/serial peripheral connection 51 may be an isolating reverse parallel optical connection that may expand the functionalities of the EVSE 100 with other peripheral devices capable of shutting off or derating the maximum amperage (rotary switch set) to any integer value as low as 6 amperes. The universal/serial peripheral connection 51 may allow for additional control or networking peripheral devices to be modularly coupled to the EVSE 100 without having to re-verify major functional aspects (e.g., safety performance tests) of these peripheral devices. Peripheral devices that may be coupled to the universal/serial peripheral connection 51 may include a Wi-Fi™ device, a credit card reader, a local area network (LAN), a cellular radio, a power line controller, an electromagnetic field (EMF) power controller, power switch, power management device and/or other devices that may be coupled to an optical connection.

Figure 3:
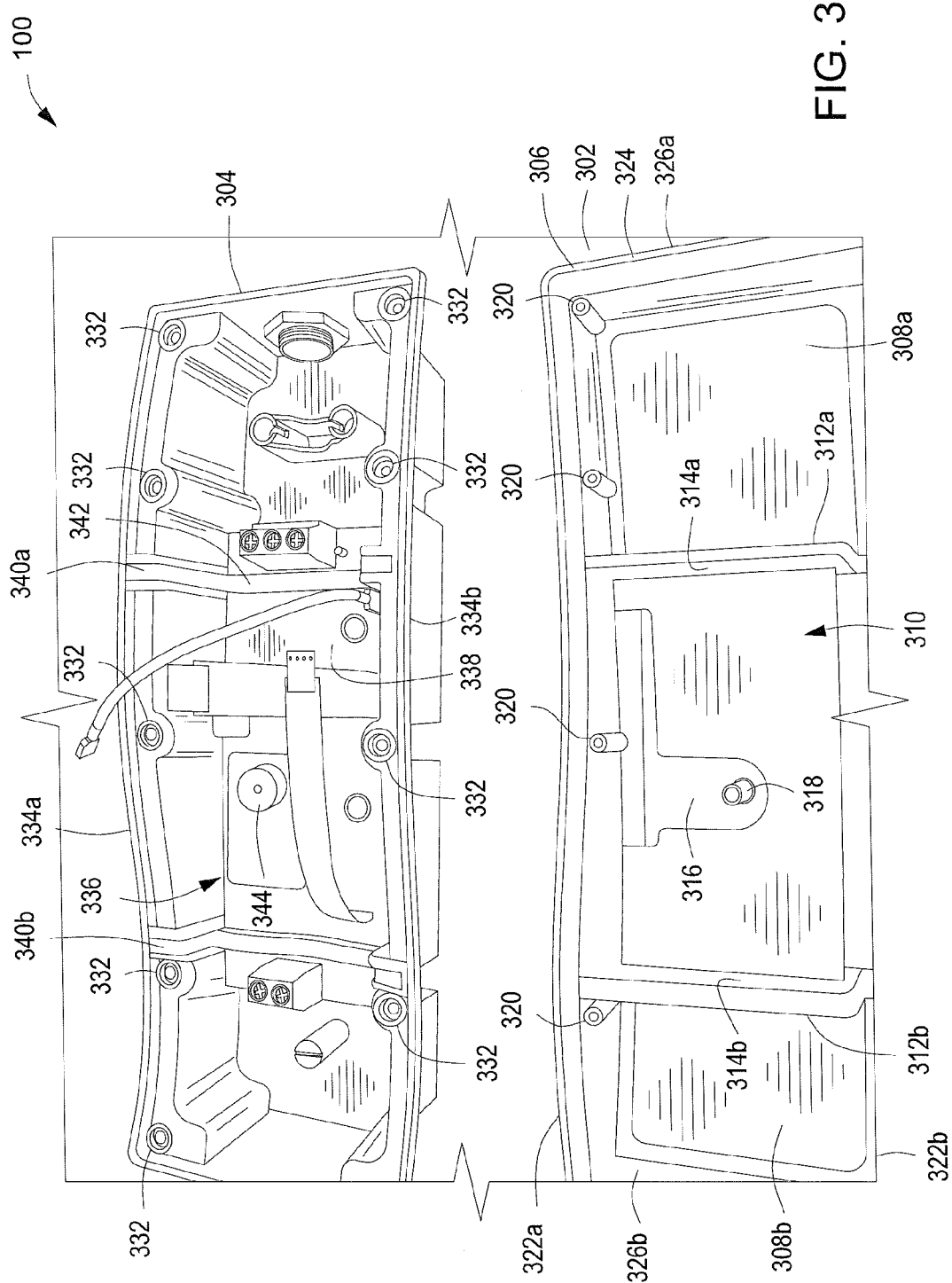
FIG. 3 shows an exploded view of an internal construction of the housing of EVSE 100 shown in FIG. 1 according to an embodiment of the invention.

FIG. 3 shows an exploded view of an internal construction of the housing of EVSE 100 shown in FIG. 1 according to an embodiment of the invention. The EVSE 100 may include a first cover element 302 and a second cover element 304. In between the first cover element 302 and the second cover element 304 may be a gasket seal material 306. The gasket seal material 306 may help ensure that water and other environmental elements are less likely to enter the EVSE 100. Additionally, the gasket seal material 306 may ensure that the first cover element 302 and the second cover element 304 may align and connect with one another and form a uniform construction.

The first cover element 302 and the second cover element 304 may be constructed of a synthetic material such as plastic or metal alloys. For example, the first cover element 302 and the second cover element 304 may be composed of a material suitable for outdoor use that may be able to withstand ultraviolet light, water exposure, immersion standards and other environmental elements. However, any type of material or materials are contemplated by the invention. The chosen material may be based on strength, water resistance, wear and tear resistance, and reduced likelihood to injure individuals handling the EVSE 100 and the like. The material may be provided with an attractive color throughout. Accordingly, if the surface of the first cover element 302 or the second cover element 304 is scratched, the scratches are less noticeable. The material may include a textured surface to further make the EVSE 100 more attractive and less likely to show wear and tear. Additionally, the first cover element 302 and the second cover element 304 are substantially water resistant in order to protect the components and wiring that are located within the EVSE 100. Although a particular shape of the first cover element 302 and the second cover element 304 is shown in FIG. 3, it is contemplated that numerous other attractive shapes could be utilized for the EVSE 100. Additionally the use of a two piece construction that includes the first cover element 302 and the second cover element 304 helps to make the assembly and servicing of the EVSE 100 easier and quicker. In that regard, the first cover element 302 may be simply removed to expose both the components and wiring of the EVSE 100. Nevertheless, the first cover element 302 and the second cover element 304 are contemplated as having a single construction in at least an aspect of the invention.

Additionally, the first cover element 302 and the second cover element 304 may be constructed with different shapes and dimensions.

The first cover element 302 having a plurality of opening portions 308a, 308b. The plurality of opening portions 308a, 308b may accommodate various displays (e.g., logo, trademarks) of EVSE 100. The first cover element 302 may include a well portion 310 formed by two gasket walls 312a, 312b. The gasket walls 312a, 312b may have a plurality of gasket materials 314a, 314b disposed on an inner surface of the gasket walls 312a, 312b, respectively. The well portion 310 may accommodate a first circuitry 316 of the EVSE 100. The first circuitry 316 may include various circuit components (not shown in FIG. 3 for clarity but are shown in FIGS. 2A and 2B) that enable an operation of the EVSE 100. A chimney stack 318 may be disposed on the first circuitry 316 and in communication with the venting hole 110 of EVSE 100. The chimney stack 318 may facilitate the flow of gases or other impurities generated during an operation of the first circuitry 316 away from the first circuitry 316 in order to prolong the lifespan of the EVSE 100. The first cover element 302 may include a plurality of shaft holes 320 located along each longitudinal sides 322a, 322b. A groove portion 324 may be formed along the each longitudinal sides 322a, 322b and each latitudinal sides 326a, 326b of the first cover element 302. The gasket seal material 306 may be arranged in the groove portion 324 of the first cover element 102 to couple with the second cover element 304 in order to seal the EVSE 100.

The second cover element 304 may include plurality of screw holes 332 located along each longitudinal sides 334a, 334b that are configured to mate with the plurality of shaft holes 320 of the first cover element 302. The second cover element 304 may include a recess portion 336 configured to receive a second circuitry 338 of the EVSE 100. The second circuitry 338 may include various circuit components that may enable operation of the EVSE 100 (as shown in FIGS. 2A and 2B). The recess portion 336 may include a plurality of groove portions 340a, 340b configured along a latitudinal direction of the second cover element 304. The plurality of groove portions 340a, 340b may accommodate a gasket strip material 342 that may correspond to the gasket walls 312a, 312b of the first cover element 302. The gasket strip material 342 and the gasket walls 312a, 312b may complete a seal compartment (e.g., composed of the well portion 310 and the recess portion 336) of the first circuitry 316 and the second circuitry 338 of the EVSE 100.

A charcoal filter 344 may be disposed on top of the second circuitry 338 that may absorb odorous or colored substances from gases or liquids of the EVSE 100. The charcoal filter 344 may be located on the secondary circuitry 338 to be in communication with the chimney stack 318 located on the first circuitry 316. In this regard, the charcoal filter 340 may absorb gases or other impurities generated from the first circuitry 316 located on the first cover element 302 and the second circuitry 338 located on the second cover element 304 in order to prolong the lifetime of the EVSE 100. The charcoal filter 344 may absorb gases or liquids of the EVSE 100 by a chemical attraction. During an operation, the EVSE 100 may generate gases or other impurities due to the high voltage required for charging the electrical battery of a vehicle. The charcoal filter 344 may absorb the gases or other impurities generated during the operation of the EVSE 100 in order to prolong the lifetime of the EVSE 100. For example, the charcoal filter 344 may provide a large surface area that may provide many absorbing sites and when gases or other impurities come in close proximity or contact with the charcoal filter 344, the gases or other impurities are attached to the charcoal filter 344 and trapped there.

Moreover, the EVSE 100 may be constructed in accordance with NEMA 4X standards. NEMA 4X standards provide that: "Enclosures constructed for either indoor or outdoor use to provide a degree of protection to personnel against access to hazardous parts; to provide a degree of protection of the equipment inside the enclosure against ingress of solid foreign objects (windblown dust); to provide a degree of protection with respect to harmful effects on the equipment due to the ingress of water (rain, sleet, snow, splashing water, and hose directed water); that provides an additional level of protection against corrosion; and that will be undamaged by the external formation of ice on the enclosure." For example, the gasket seal material 306, the gasket walls 312a, 312b having a plurality of gasket materials 314a, 314b disposed on an inner surface of the gasket walls 312a, 312b, and the plurality of groove portions 340 that may accommodate a gasket strip material 342 enable the EVSE 100 to achieve the NEMA 4X standards in order to provide a sealed enclosure for the EVSE 100. Also, the gasket seal material 306, the plurality of gasket materials 314a, 314b disposed on an inner surface of the gasket walls 312a, 312b, and the gasket strip material 342 may be made of the same material or different materials, for example, may include silicon, plastic, rubber, foam, polyurethane and/or other sealant material. Of course, other types of materials and potting configurations are contemplated by the invention.

Additionally the first circuitry 316 and the second circuitry 338 may also include various components arranged outside the potting material 402. For example, if the first circuitry 316 and the second circuitry 338 are configured with a fuse or other similar structure which may require maintenance from time to time, such components may be arranged outside the potting material 402. For example, the second circuitry 338 may include a Nano fuse which may be located outside well 310 so that a service technician can replace the Nano fuse during maintenance without disturbing the potting material 402.

FIG. 4A and FIG. 4B show a sectional views taken alone line IVA-IVA and IVB-IVB of the housing of the EVSE shown in FIG. 1 according to an embodiment of the invention. The EVSE 100 may be filled with a potting material 402. For example, the potting material 402 may filled in the well portion 310 of the first cover element 302 and the recess portion 336 of the second cover element 304 in order to seal first circuitry 316 and the second circuitry 338. The potting material 402 may be a solid or gelatinous compound that may fill the EVSE 100 and may increase the resistance of the EVSE 100 to shock and vibration, and for exclusion of gaseous, moisture and corrosive agents. For example, the potting material 402 may include epoxy, polyurethane, thermo-setting plastics, silicone rubber gels, and/or other similar materials. The potting material 402 may be injected into the EVSE 100 and the potting material 402 may expand to cover the first circuitry 316 and the second circuitry 338 in order to form a seal within the EVSE 100. Alternatively or additionally, the first circuitry 316 and the second circuitry 338 of the EVSE 100 may include a layer of transparent conformal coating providing a similar seal as the potting material 402 in order to protect the first circuitry 316 and the second circuitry 338. The transparent conformal coating may include low glass transition temperature (Tg) material such as polyurethane or silicone.

Accordingly the aspects described above result in a housing for a battery charger that is easy to use and access, is better protected from damage, safer for people, pets, animals and vehicles, less likely to damage the property of others, that is resistant to environmental damage, that is attractive and blends into the streetscape, simple to install, has a compact design, and includes a design that results in low cost service and maintenance.

The many features and advantages of the invention are apparent from the detailed specification, and thus, it is intended by the appended claims to cover all such features and advantages of the invention which fall within the spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. An electric vehicle supply equipment comprising:
a first cover element comprising a well portion to accommodate a first circuitry; a chimney stack disposed on the first circuitry that corresponds to a venting hole, the chimney stack facilitates a flow of gasses;
a second cover element comprising a recess portion to accommodate a second circuitry; a charcoal filter disposed on the second circuitry that corresponds to the chimney stack, the charcoal filter absorbs impurities generated by the first circuitry and the second circuitry; and
a universal/serial connection port configured to couple to peripheral devices, wherein the universal/serial connection port is an optical coupled connection, wherein the first or second circuitry includes a voltage regulator having a first low voltage and a second higher voltage to move a relay.

2. The electric vehicle supply equipment of claim 1, wherein the well portion and the recess portion are filled with potting material to encapsulate the first circuitry and the second circuitry.

3. The electric vehicle supply equipment of claim 1, wherein the first cover element and the second cover element are constructed to meet NEMA 4X standards.

4. The electric vehicle supply equipment of claim 1, wherein the optical coupled connection is an isolating reverse parallel optical connection.

5. The electric vehicle supply equipment of claim 1 further comprising a water proof connector.

6. The electric vehicle supply equipment of claim 4, wherein the isolating reverse parallel optical connection is configured to shut off or derating a maximum amperage of the peripheral devices.

7. An electric vehicle supply equipment comprising:
a first cover element having a well portion that accommodates a first circuitry;
a chimney stack disposed on the first circuitry that corresponds to a venting hole on the first cover element, the chimney stack facilitates a flow of gasses that are generated during use of the electric vehicle supply equipment;
a second cover element comprising a recess portion to accommodate a second circuitry;
a charcoal filter disposed on the second circuitry that corresponds to the chimney stack, the charcoal filter absorbs impurities generated by the first circuitry and the second circuitry;
a universal/serial connection port configured to couple to peripheral devices, wherein the universal/serial connection port is an optical coupled connection;
a control circuit that passes signals representing a voltage on an electrical conduit to a processor that controls a relay; and
a voltage regulator that provides additional voltage levels to operate the relay, wherein the additional voltage levels include a first low voltage for maintaining the relay in a first position and a second higher voltage for moving the relay to a second position.

8. The electric vehicle supply equipment of claim 7, wherein the well portion and the recess portion are partially filled with a potting material to encapsulate portions of the first circuitry and the second circuitry.

9. The electric vehicle supply equipment of claim 7, wherein the first cover element and the second cover element are constructed to meet NEMA 4X standards.

10. The electric vehicle supply equipment of claim 7, wherein the optical coupled connection is an isolating reverse parallel optical connection.

11. The electric vehicle supply equipment of claim 7 further comprising a water proof connector.

12. The electric vehicle supply equipment of claim 10, wherein the isolating reverse parallel optical connection is configured to shut off or derating a maximum amperage of the peripheral devices.

* * * * *